United States Patent
Abbaspour et al.

(10) Patent No.: US 8,122,411 B2
(45) Date of Patent: Feb. 21, 2012

(54) METHOD OF PERFORMING STATIC TIMING ANALYSIS CONSIDERING ABSTRACTED CELL'S INTERCONNECT PARASITICS

(75) Inventors: Soroush Abbaspour, Hopewell Jct., NY (US); Debjit Sinha, Hopewell Jct., NY (US)

(73) Assignee: International Business Machines Corporation, Armonk, NY (US)

( * ) Notice: Subject to any disclaimer, the term of this patent is extended or adjusted under 35 U.S.C. 154(b) by 305 days.

(21) Appl. No.: 12/503,924

(22) Filed: Jul. 16, 2009

(65) Prior Publication Data

US 2011/0016442 A1 Jan. 20, 2011

(51) Int. Cl.
*G06F 17/50* (2006.01)
(52) U.S. Cl. ............ 716/113; 716/108; 716/136
(58) Field of Classification Search ............ 716/108, 716/113, 136
See application file for complete search history.

(56) References Cited

U.S. PATENT DOCUMENTS

| | | | |
|---|---|---|---|
| 6,405,348 B1 * | 6/2002 | Fallah-Tehrani et al. | 716/113 |
| 6,604,227 B1 | 8/2003 | Foltin et al. | |
| 6,609,233 B1 | 8/2003 | Foltin et al. | |
| 6,763,504 B2 * | 7/2004 | Rao et al. | 716/113 |
| 6,857,110 B1 * | 2/2005 | Rupp et al. | 716/136 |
| 6,954,915 B2 * | 10/2005 | Batchelor | 716/113 |
| 6,983,432 B2 * | 1/2006 | Hayes | 716/113 |
| 6,996,515 B1 | 2/2006 | Foltin et al. | |
| 7,103,863 B2 * | 9/2006 | Riepe et al. | 716/113 |
| 7,788,617 B2 * | 8/2010 | Bhanji et al. | 716/113 |
| 7,958,473 B2 * | 6/2011 | Dirks et al. | 716/108 |
| 2009/0031268 A1 * | 1/2009 | Miranda et al. | 716/6 |
| 2010/0211922 A1 * | 8/2010 | Sinha et al. | 716/6 |

OTHER PUBLICATIONS

Dartu et al. "Performance Computation for Precharacterized CMOS Gates with RC Loads"; IEEE; vol. 15, No. 5, May 1996; pp. 544-553.*
RICE: Rapid Interconnect Circuit Evaluation Using AWE, Curtis L. Ratzlaff and Lawrence T. Pillage, IEEE Transactions, vol. 13, Issue 6, Jun. 1994, pp. 763-776.
Calculating the Effective Capacitance for the RC Interconnect in VDSM Technologies, Soroush Abbaspour and Massoud Pedram, Proceedings Asia South Pacific Design Automation Conference 2008, pp. 43-48.
U.S. Appl. No. 12/426,492-titled: Method of Employing Slew Dependent Pin Capacitances to Capture Interconnect Parasitics During Timing Abstraction of VLSI Circuits, filed Apr. 20, 2009, Debjit Sinha, et al.

* cited by examiner

*Primary Examiner* — Naum Levin
(74) *Attorney, Agent, or Firm* — H. Daniel Schnurmann (57) ABSTRACT

An abstraction model supporting multiple hierarchical levels is inputted into a generalized static timing analysis of a hierarchical IC chip design to analyze and optimize the design of circuits integral to the chip containing a plurality of macro abstracts. An electrical network, synthesized for an internal abstract interconnect segment, is performed only once per macro and is applied to multiple instances of the macro abstract model in the IC chip design. The synthesized electrical network is a resistive capacitive or a resistive inductive capacitive network or a combination thereof. The synthesized electrical network is then used to match impulse response transfer functions of the network and the abstract interconnect segment's timing model. This network is stitched with the electrical parasitics of external interconnect segments connected to macro primary outputs. Various model order reductions are then performed on the electrical parasitics of external interconnects prior to network stitching. A static timing analysis is performed on the final network.

16 Claims, 7 Drawing Sheets

METHOD OF PERFORMING STATIC TIMING ANALYSIS CONSIDERING ABSTRACTED CELL'S INTERCONNECT PARASITICS

FIELD OF THE INVENTION

The invention generally relates to the field of Design Automation of a hierarchical Very Large Scale Integrated (VLSI) chip, and more particularly, to a method for improving a circuit design having abstracted timing models including interconnect parasitics.

BACKGROUND OF THE INVENTION

Static Timing Analysis (STA) is a key step in the design of high speed Very Large Scale Integrated (VLSI) circuits. It is used to verify that a given VLSI circuit design performs correctly at a required frequency before it is released to manufacturing. STA is performed on a timing graph representation of the design; the points in the design where timing information is desired constitute the nodes or timing points of the graph, while electrical or logic connections between nodes are represented by timing arcs of the graph. STA typically consists of certain fundamental steps that include:

i. delay calculations, which involves modeling and calculating delays across the gates and interconnects (represented by timing arcs) included in the timing graph representation of the design;

ii. propagation and calculation of signal arrival times, required arrival times and slews across all timing points, and iii. slack calculation across all timing points of the design.

With modern chip manufacturing technology scaling to sub-65 nanometers, VLSI designs are increasingly getting larger in terms of size and complexity. Design-architecture, analysis and/or optimization of any such large design is immensely complex, and often prohibitive. For example, timing optimization of a flattened microprocessor design would be practically impossible by any Computer-Aided Design tool from a tool run-time and memory consumption perspective. Given the numerous iterations that a design optimization flow requires, a flattened view of a design also prohibits parallel design-architecture and optimization efforts. These challenges coupled with aggressive time-to-market schedules have led to a hierarchical design view, analysis and optimization flow for modern VLSI designs. A high level design partitioning is performed to create the hierarchy. Partitioning may be performed recursively within a level of hierarchy to create a global multi-level hierarchy of the chip design.

In hierarchical timing, the partition of the design at a given level of hierarchy is analyzed in isolation. This facilitates analysis and/or optimization of different partitions of the design in parallel. In the context of timing verification, detailed (accurate, using complex timing models or circuit simulation engines) static timing analysis of a partition is followed by the generation of timing abstract models that reflect in a simpler form, the actual timing characteristic of the partition being analyzed. The latter step is termed timing abstraction. For ease of notation, hereinafter, the term macro will be used to denote any circuit partition being abstracted, irrespective of the global level of hierarchy. A macro may represent a transistor level design, consisting of Field Effect Transistor (FET) devices and interconnects, or a gate level design, consisting of gates and interconnects. Inputs and outputs of the macro are denoted as macro primary inputs (PIs) and macro primary outputs (POs), respectively.

A generated abstract captures the timing characteristic of the macro using slew and load dependent tables to model the timing behavior of the logic. The abstract model is required to be context-independent, that is, independent of the voltage waveforms (slews) at its primary inputs and loads at its primary outputs. Consequently, delays and output slews (or waveforms) of timing arcs near the primary inputs of the macro are characterized as functions of input slew, while delays and output-slews of arcs closer to the macro primary outputs are characterized as a function of output load, and sometimes a combination of both. This allows the generated abstract models to be used in multiple boundary condition (PI and PO) settings. Timing abstraction employs techniques directed to reducing the size of the timing graph by performing pruning as well as arc compression. These techniques can reduce significantly the number of timing arcs to be timed at the next level of hierarchy. The abstract model essentially represents the macro as a complex gate, and obfuscates the internal details of the circuit. This may be desirable for generating designs shared between vendors, and provides motivation for generation of abstracts as industry standard gate models.

Figure 1:
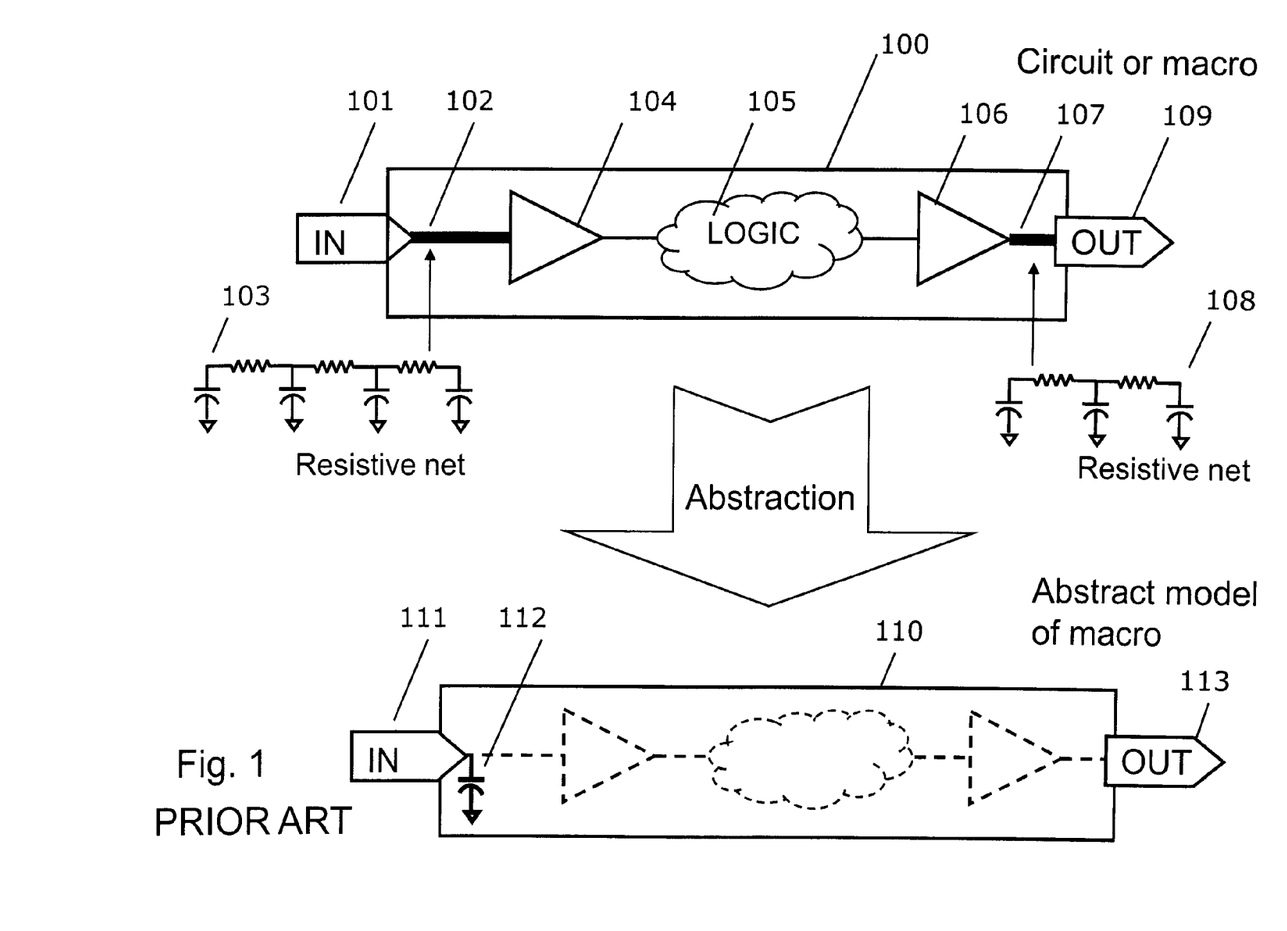
FIG. 1 illustrates the generation of a prior art timing abstract model for a given macro.

Referring to FIG. 1, an illustrative macro 100 is shown having a macro primary input port 101 and a macro primary output port 109. An interconnect 102 (also referred to as a net) connects the primary input to gate 104. Gate 104 feeds logic 105 that includes other gates and nets, and finally connects to gate 106. Net 107 connects gate 106 to the macro primary output 109. The resistance-capacitance (RC) parasitics of the interconnect segment 102 are referenced by numeral 103, while the RC parasitics of the interconnect segment 107 are referenced by numeral 108. The timing abstract model of the macro is shown as block 110. The macro primary input port 101 and macro primary output port 109 are preserved in the abstract model as 111 and 113, respectively. However, the internal segments and components of the macro (e.g., 102 and 104) are abstracted and may even be merged. Block 110 is considered as a complex gate that no longer includes interconnects. The timing arcs in the abstract model are characterized some as functions of input slew, or output load or both, and the timing model is stored preferably in a standard industry format (e.g., lib© format). To capture the load seen from the primary input, the total capacitive load of the interconnect segment 102 and the input pin capacitance of gate 104 are summed and set as the lumped pin capacitance 112 on the input port 111 of the abstract model. The load seen from the macro PI may also be captured as a slew dependent pin capacitance as described in co-pending U.S. patent application Ser. No. 12/426,492 of the same assignee. This avoids approximating the parasitics 103 of interconnect segment 102 as a lumped capacitance, thereby helping to improve the accuracy of the STA at the next (upper) level of hierarchy.

Pin capacitances are preferably stored only for the macros' PIs of the abstract. This is because any logic feeding (or driving) the abstract model at an upper level of hierarchy requires only the load seen from the PI of the macro during timing analysis of the logic. Since all the internal interconnect segments (that are not directly connected to a primary input) in a given macro are characterized (for delay and output waveform/slews), and are not fed by any external logic during hierarchical timing, their respective parasitics information is not stored. For illustrative purposes, in prior art FIG. 1, the delay and output waveform/slew across interconnect segment 102 is accurately characterized as a function of different voltage waveforms (i.e., a range of input slews) at the macro PI during abstraction. Characterization takes into account detailed parasitics 105 of the interconnect segment, and is thus accurate. Interconnect segments that are connected to the macro POs and gate segments feeding the macro interconnect segments are both characterized (as functions of input waveform/slew and load at macro primary output), accurately taking into account the detailed interconnect parasitics. Since no external logic is expected to feed the segments directly during hierarchical timing, a lumped pin capacitance capturing the parasitics for these interconnect segments is typically not required. Consequently, the RC parasitics of the interconnect segments connected to the macro PIs (e.g., segment 108 in macro 100, FIG. 1) are not captured in the abstract.

At the next (upper) level of hierarchy (referenced as chip level, for ease of notation), macros are represented by their corresponding abstracts. The term chip level is generically applied to denote a level of hierarchy where an abstract generated at a lower level of hierarchy is included for STA.

Figure 2:
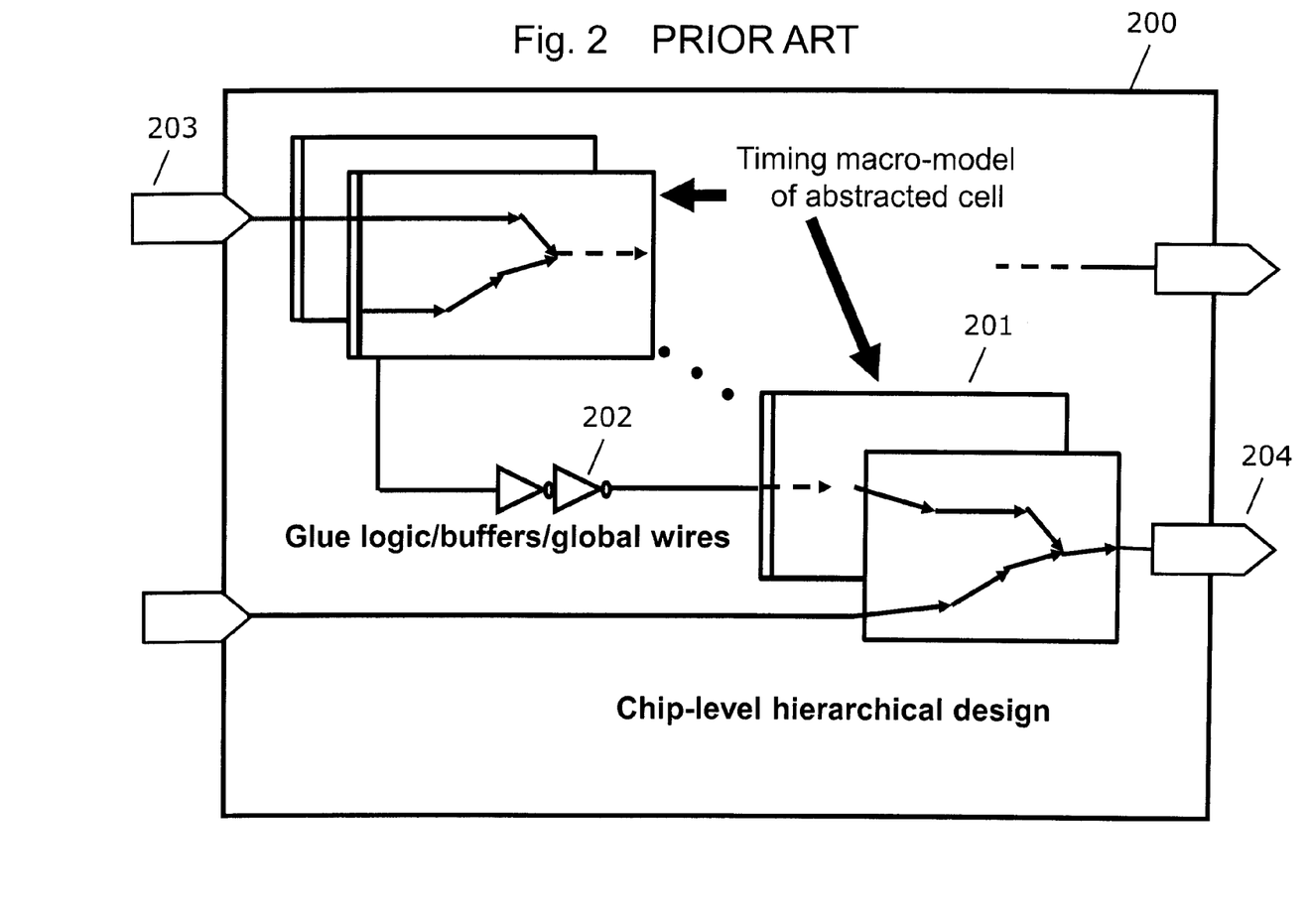
FIG. 2 shows a prior art hierarchical design at chip level including multiple macros connected to each other and to the primary inputs and outputs via glue logic.

Referring now to FIG. 2, a hierarchical design 200 is shown at the chip level of hierarchy that includes multiple abstracted macros. One abstracted macro within this chip level of hierarchy is labeled 201. Each macro internal to block 200 is not necessarily unique. Multiple instances of a particular macro may exist at upper levels of the hierarchy. These are modeled using multiple instances of the abstract corresponding to a particular macro. Global wires and gates (termed glue-logic, e.g., 202) are connected to one or more macros within the chip level, as well as to the PIs and Pos at the chip level. Each unique macro is separately timed and abstracted and, subsequently, the abstract model is used to denote its timing model during hierarchical chip-level STA.

The hierarchical timing approach enables fast timing analysis and enhances the productivity at the chip level since the abstract models are simple table-lookup models (that facilitate a fast delay and/or slew computation) and allow re-use. These benefits are significantly highlighted when multiple instances of a macro appear at the chip level since the flow avoids expensive separate static timing analysis for each instance of the macro by limiting accurate STA and abstraction only once per unique macro.

Although abstraction provides significant productivity improvements at chip level timing, the conversion of a complex macro containing interconnect segments and gates to an abstract gate model poses potential timing accuracy issues in certain situations. For example, if the interconnect segment connected to a macro PI is highly resistive and the parasitics of this segment is captured as a lumped pin capacitance in the abstract PI, a gate driving this abstract at the chip level will incur inaccuracies during delay and output slew calculation, since it sees a lumped load instead of detailed RC parasitics. Co-pending U.S. patent application Ser. No. 12/426,492 describes a method to overcome this problem by capturing interconnect RC parasitics as a slew dependent pin capacitance on the PI of the abstract. A similar problem exists when an interconnect segment connected to a macro PO is resistive. This problem is, however, not addressed by the above invention.

SUMMARY OF THE INVENTION

In one aspect of the invention, a method is provided for performing a static timing analysis of a hierarchical Very Large Scale Integrated (VLSI) circuit design containing abstracted timing models, taking into account interconnect parasitics. The method is advantageously used in early stages of the design and serves as a guide to meet design targets and verification.

In another aspect of the invention, circuits integral to the VLSI chip are analyzed and optimized by synthesizing an electrical network of an internal abstract interconnect segment, followed by stitching the synthesized electrical network with electrical parasitics corresponding to an external interconnect connected to one or more abstracted primary outputs. The static timing analysis on interconnects of the stitched electrical network can be performed only once per unique macro and, subsequently, applied to multiple instances of the macro's abstract model.

The synthesized electrical network is formed by a resistive capacitive (RC) or a resistive inductive capacitive (RLC) network or a combination thereof RC(L). The synthesized electrical network matches impulse response transfer functions of the network including the abstract interconnect segments timing model. Various model order reductions are then performed on the electrical parasitics of external interconnects prior to network stitching.

In still another aspect of the invention, a method and a system for analyzing and/or optimizing circuits integral to a VLSI chip is achieved by performing an accurate static timing analysis of an integrated circuit (IC) macro abstracts, the method including: a) identifying an interconnect segment of the macro abstract model and its timing model that is connected to one or more abstract primary outputs; b) synthesizing an electrical network from the timing model and incorporating the synthesized electrical network into the interconnect segment; c) stitching the synthesized electrical network with electrical parasitics of an external interconnect connected to one or more of the abstract primary outputs; d) performing with a computer a static timing analysis on the interconnects of the stitched electrical network; and e) modifying the circuits integral to the VLSI chip by applying thereto results from the interconnect static timing analyses of the macro abstract models.

BRIEF DESCRIPTION OF THE DRAWINGS

The accompanying drawings, which are incorporated in and which constitute part of the specification, illustrate the presently preferred embodiments of the invention which, together with the general description given above and the detailed description of the preferred embodiments given below serve to explain the principles of the invention.

DETAILED DESCRIPTION

The present invention and the various features and advantageous details thereof are explained more fully with reference to the non-limiting embodiments that are illustrated in the accompanying drawings and detailed in the following description of an embodiment of the invention.

Figure 3:
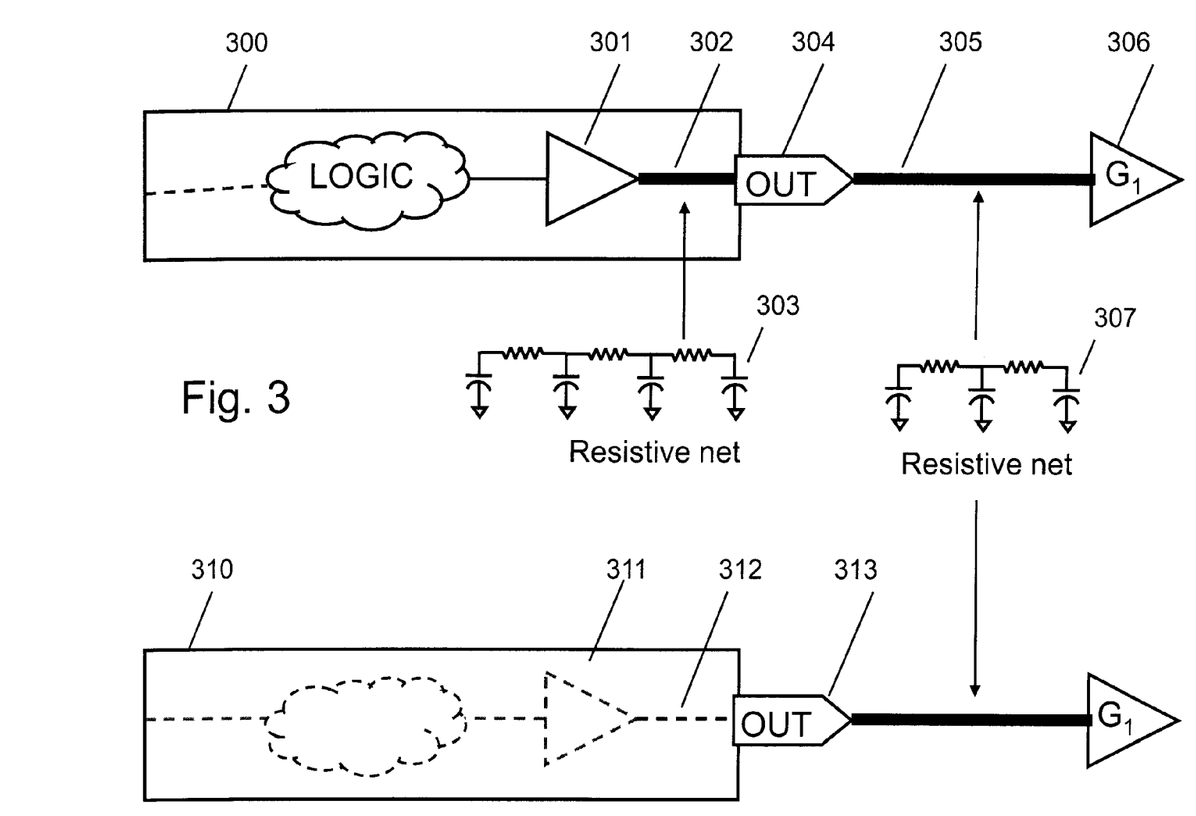
FIG. 3 illustrates a macro driving a gate via a resistive interconnect segment and compares it to an instance where an abstract model of the macro drives an identical gate.

Referring to FIG. 3, there is shown a chip level hierarchy, wherein macro 300 drives a gate $G_1$ 306 via a global interconnect segment 305. The macro is abstracted and the abstract model 310 is used for STA at the chip level. During abstraction, delay and output slew of timing arcs 300 are characterized, allowing the timing arcs to be merged. Typically, the timing arc corresponding to the interconnect segment 302 in 300 is not merged with other timing arcs but is retained as a timing arc 312 in abstract 310. Additionally, 312 is identified or attributed with additional information that allows the timing arcs that are connected to the source pin 312 to view the load at its sink pin. To highlight a potential source of inaccuracy in the abstract model, the situation when the macro 300 drives gate $G_1$ is compared to the instance where the abstract 310 drives an identical gate $G_1$, both via global interconnects having identical RC parasitics (denoted as 307). Assuming identical input voltage waveforms at the PIs of the macro and abstract, the timing information propagated to the source pins of timing arcs corresponding to 302 and timing arc 312 are expected to be identical. The timing propagation analysis across the last arc in the macro, however, differs with that of the abstract. In the former case, the RC parasitics 303 of 302 are combined with parasitics 307 of global interconnect 305. The combined parasitics and the input slew at the source 302 are then sent to an interconnect delay calculator (for example, RICE©) which computes the timing analysis results at the macro PO pin OUT as well as the input pin of gate $G_1$. In the latter case, the timing arc 312 in the abstract corresponding to the interconnect segment 302 is part of the abstract (or a complex gate) and does not contain any RC parasitics. The delay and output slew of this arc, however, have been characterized as functions of input slew and output load during abstraction and are stored as lookup tables. A timing analysis of this arc is performed in a similar manner to the timing analysis of a gate timing arc which, in this case, drives an interconnect segment with RC parasitics 307. This involves "effective capacitance" or "Ceff" calculations to obtain the timing information at PO 313 of block 310. The result of the analysis differs from the former case where an interconnect delay calculator computes the timing information at PO 304 of block 300 (and therefore introduces timing inaccuracies). Although the timing analysis between the macro/abstract PO and PI of $G_1$ is performed preferably using an interconnect delay calculator, the timing inaccuracy at the PO of the abstract propagates downstream and is a source of timing inaccuracy during a hierarchical STA at chip level using abstract models. An inaccurate chip level STA can lead to false positives in timing verification of the chip design, causing hardware failures and potential yield loss of the manufactured VLSI chip.

Storing RC parasitics 303 in the abstract model and using them during an STA at the chip level is seemingly an alternate solution to avoid the inaccuracy problems described above. However, this approach is not attractive for the following reasons:

The abstract may be needed to be modeled as an industry standard complex gate model (e.g., a lib© model). Such models do not allow capturing RC parasitics in the model and assume that all the arcs in the model are gate (non-interconnect) timing arcs;

The abstract may need to be a black-box model for proprietary considerations of sharing data between VLSI design vendors, in which a vendor may be reluctant to share design details including parasitics for the original macro that was abstracted; and There is a need for a solution that can address the inaccuracy problem in a given abstract that does not contain RC parasitics instead of having to regenerate an abstract with additional information.

Figure 4A:
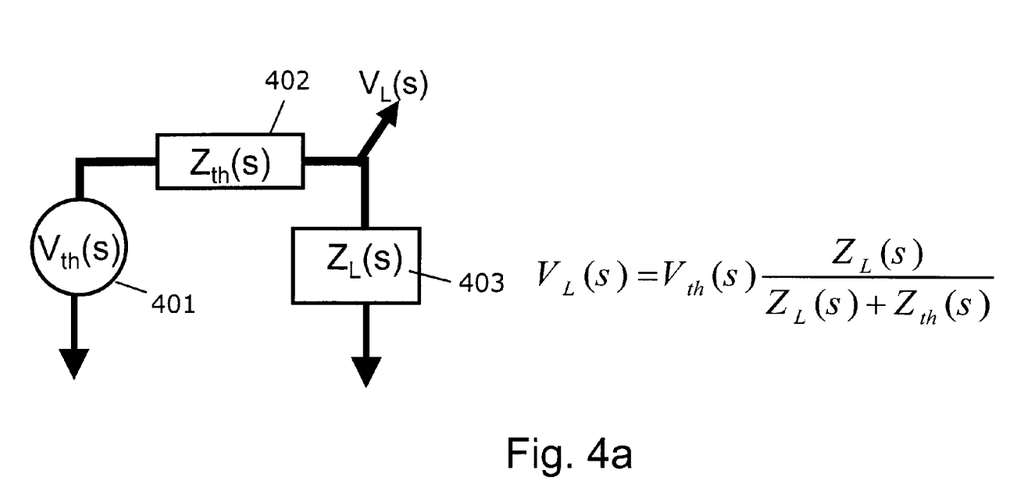
FIG. 4 illustrates circuit theory fundamentals used as a basis for an embodiment of the invention.

A sample linear time invariant (LTI) circuit is shown in FIG. 4(a) where an input voltage source $V_{th}(s)$ 401 is connected to two LTI impedances in series: $Z_{th}(s)$ 402 and $Z_L(s)$ 403. Using circuit theory, the voltage difference, $V_L(s)$, at the two terminals of the load impedance 403, in Laplace domain are shown by the following equation:

$$V_L(s) = V_{th}(s) \frac{Z_L(s)}{Z_L(s) + Z_{th}(s)} \qquad \text{EQ. 1}$$

where $V_{th}(s)$ is the input voltage source, $Z_{th}(s)$ is the line impedance, and $Z_{th}(s)$ is the load impedance, all in Laplace domain.

Figure 4B:
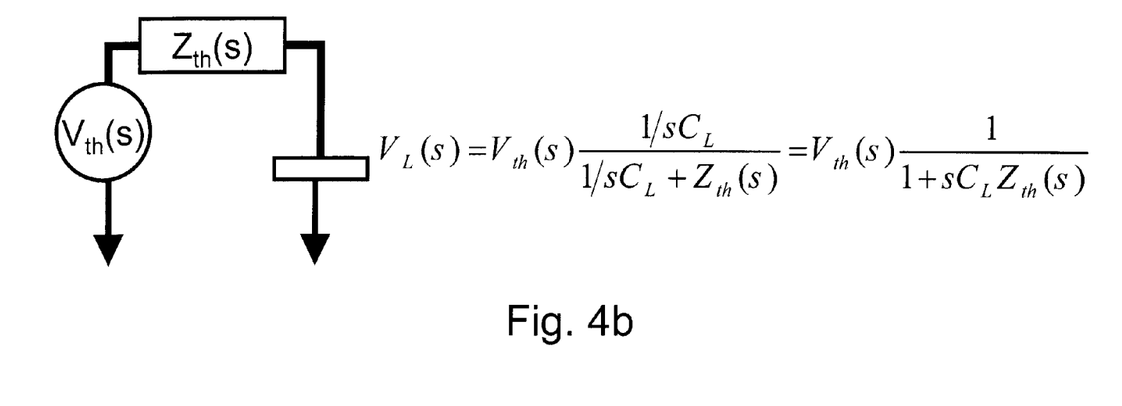

Referring to FIG. 4(b), the following equation is obtained when the load impedance in EQ. 1 is replaced by a capacitance:

$$V_L(s) = V_{th}(s) \frac{1/sC_L}{1/sC_L + Z_{th}(s)} \qquad \text{EQ. 2}$$

Rearranging the terms, the above equation can be simplified as follows:

$$V_L(s) = V_{th}(s) \frac{1}{1 + sC_L Z_{th}(s)} \qquad \text{EQ. 3}$$

EQ. 3 is used as a basis to achieve an accurate static timing analysis considering the abstracted cells interconnect primary output parasitics.

As described earlier, the internal interconnect parasitics at the PO of the macro are usually abstracted by a delay and a slew table. It is evident that a conventional Ceff based algorithm that calculates the delay and slew of the internal interconnect segment at the macro PO attached to a resistive net at macro PO will result in an erroneous timing. In order to preserve the accuracy of timing analysis using abstracted models, in one embodiment of the invention a passive resistive-capacitive (RC) or a resistive-capacitive-inductive (RLC), jointly denoted as an RC(L) network, is synthesized from the abstracted delay/slew/waveform table. Synthesis is performed such that the voltage response of the synthesize RC(L) network and the abstracted delay/slew/waveform tables to the same input voltage and output load closely follow each other.

Abstraction reduces the complexity of the large-scale interconnect networks to the delay/slew/waveform tables. Delay/slew/waveform tables are characterized for certain combinations of input slew and output capacitive loads during the abstraction process and stored in a table/equation format. In an embodiment of the invention, during synthesis of the passive RC(L) network, delay, slew, and waveform tables are utilized, while preserving (to the possible extent) the input-output timing behavior. In other words, the timing tables are reduced to a small interconnect network, such that when the same input signal is applied to the timing table and synthesized interconnect, the output response will closely match each other. Note that higher order reduced models will display a similar behavior as the original interconnect network while adding more complexity during analysis. For instance, a first reduced order model can be speedily analyzed, but it may destroy the input-output behavior of the system. Therefore, there is a trade-off between accuracy and speed for determining the order of the reduced model.

Several techniques are advantageously applied to synthesize a reduced order RC(L) network from the delay/slew/waveform tables. A brute-force technique to obtain the reduced order RC(L) network from the timing tables is to run an optimization program by formulating the output voltage response of the LTI system as a function of the input voltage waveform. One may then try to obtain a reduced order model which minimizes the mean of the squared error between the timing quantity in the table and the equation attributed to each input waveform. The order of the RC(L) network can be either a user specified value or an integral part of the optimization process. Although this technique may obtain accurate results, it is costly to run and, thus, may not be a practical solution. A more efficient technique is to synthesize the RC(L) network by minimizing the reduced order model response by using a selective number of timing quantities in the table.

Figure 5:
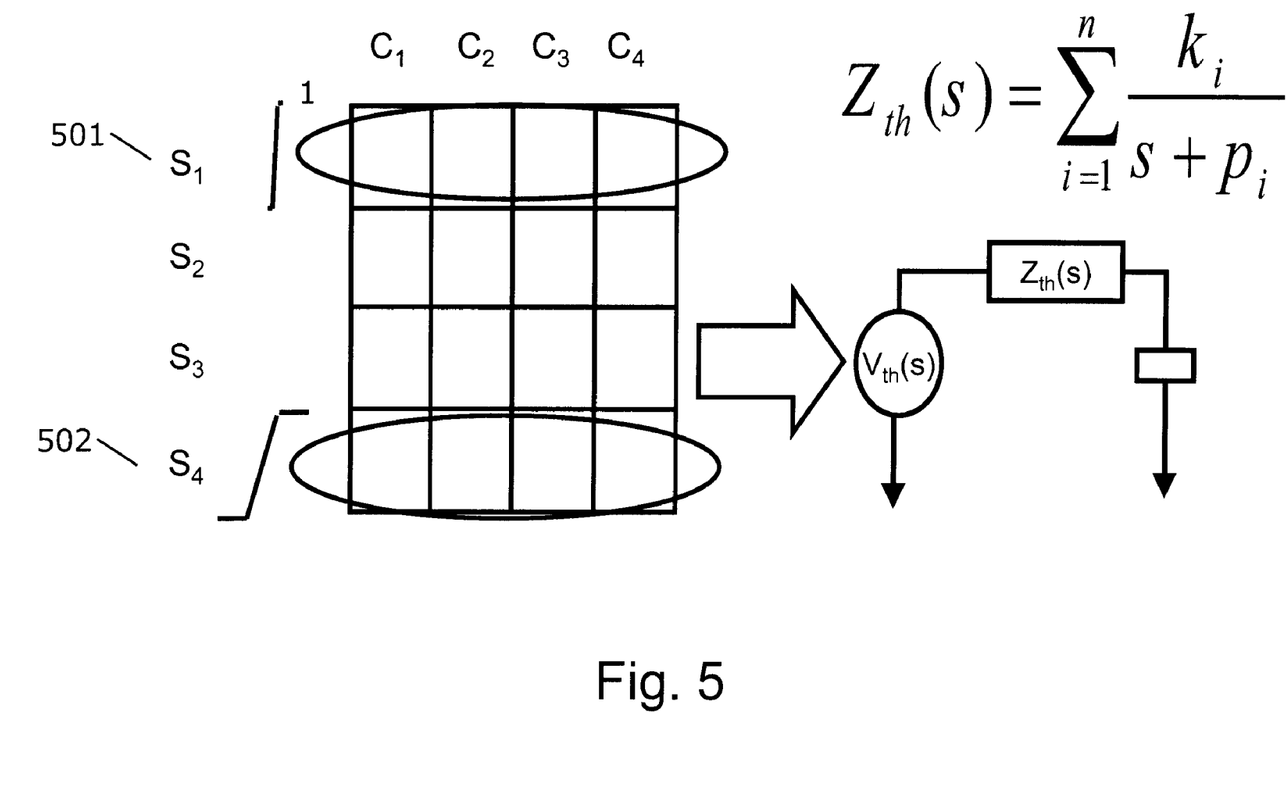
FIG. 5 shows a method used to synthesize an RC or RLC interconnect network from abstracted timing (delay/slew/waveform) tables, according to an embodiment of the present invention.

For illustrative purposes, referring to FIG. 5, passive RC(L) networks are low-pass systems generally filtering out the high frequency components of the input signals. As mentioned earlier, during the abstraction process of each timing segment, a timing table is characterized and tabulated as a function of input slew applied to the input pin of the timing segment and output capacitive load that is attached to the output pin of the timing segment. In the sample timing table shown in FIG. 5, S1, S2, S3 and S4 are different input slew values, and C1, C2, C3, and C4 are different output capacitive load values which are used to characterize the timing segment. In order to preserve the behavior of the synthesized model to high frequency components of the input waveform, the row corresponding to the minimum input slew 501 is chosen for the optimization process. In addition, to preserve the timing behavior of the RC(L) network for a wider range of input slews, the timing row corresponding to the maximum slew of the timing table 502 is selected. Either a delay table, or slew table, or waveform table are selected to synthesize the RC(L) network.

Figure 6:
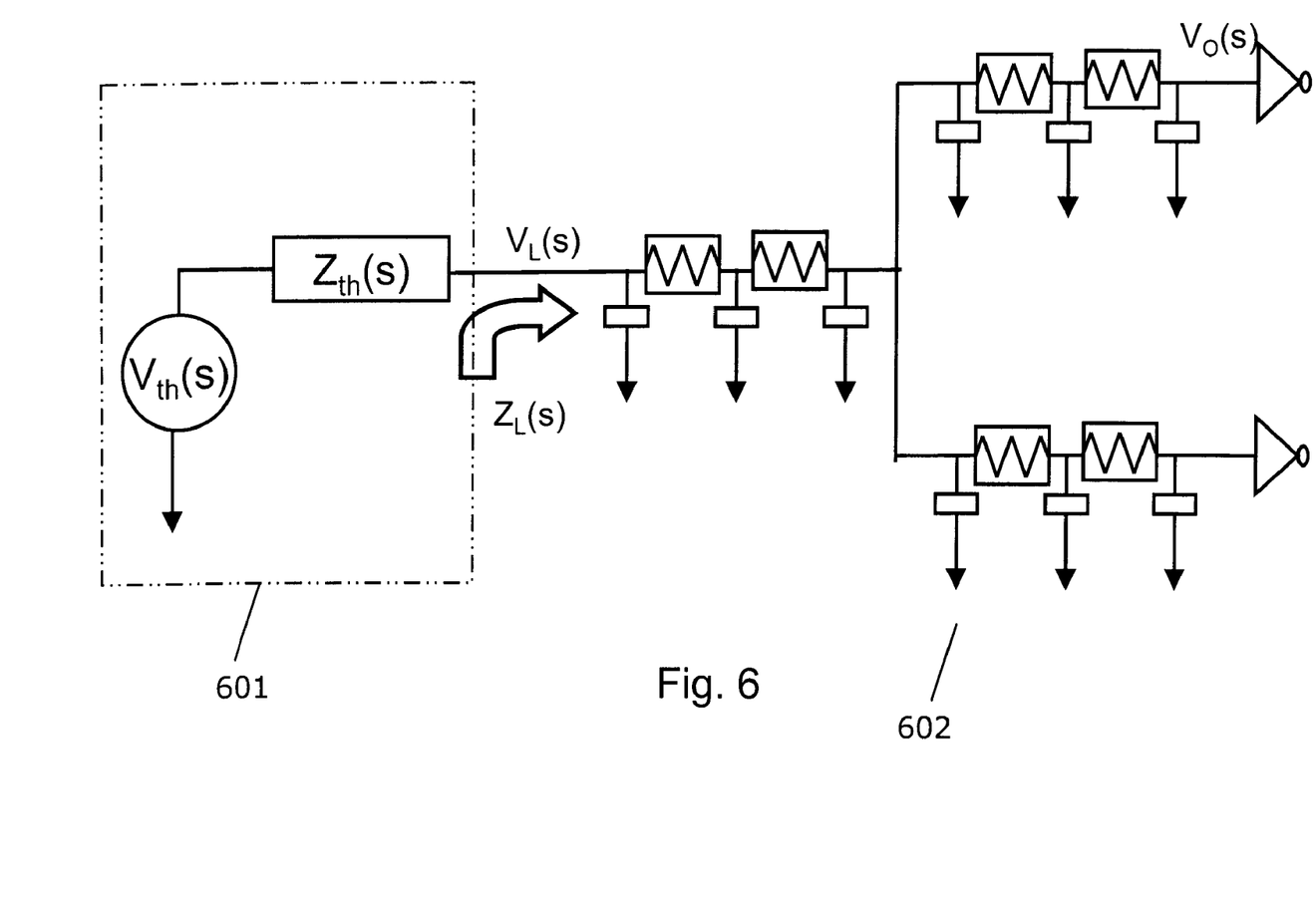
FIG. 6 illustrates an example of using a synthesized model in conjunction with the interconnect parasitics attached to the macro PO.

Abstract models may be instantiated several times during the chip design. Referring to FIG. 6, there are shown output pins of the abstract models that are attached to an interconnect network with multiple fan-outs. To make the process more efficient, when the RC(L) network is synthesized, the system thus obtained can be cached and used for other instantiations of the macro in the circuit.

It is worth noting that following synthesizing the model, the system 601 consisting of $V_{th}(s)$ and $Z_{th}(s)$ thus obtained and the interconnect parasitics 602 attached to the abstraction primary output can be inputted into an interconnect timing analysis engine in order to obtain the interconnect delay/slew/voltage waveform/current waveforms at any node of the circuit. For instance, the following equation can be used to calculate the voltage waveform at the PO of the abstract:

$$V_L(s) = V_{in}(s) \frac{Z_L(s)}{Z_L(s) + Z_{syn}(s)} \qquad \text{EQ. 4}$$

where $V_L(s)$ is the voltage waveform at the PO of the macro in Laplace domain; $V_{in}(s)$ is the voltage waveform at the input of the internal interconnect segment attached to the PO of the macro; $Z_L(s)$ is the load impedance to ground in Laplace domain; and $Z_{syn}(s)$ is the impedance of the synthesized RC(L) network in Laplace domain.

Figure 7:
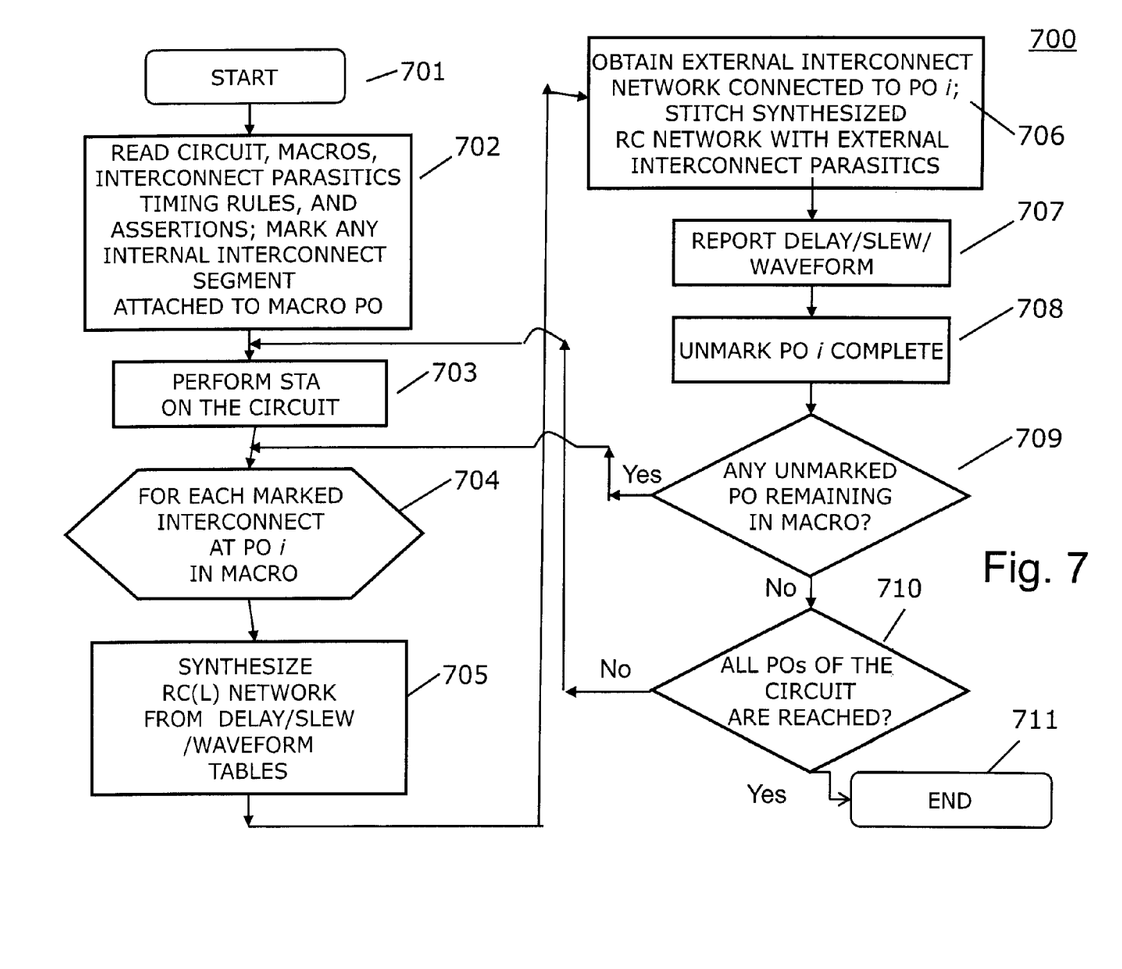
FIG. 7 shows a flow chart of one embodiment of the invention.

Moreover, the voltage waveform at a sink of the interconnect attached to the PO of the abstract can be represented as:

$$V_o(s) = V_{in}(s) \frac{Z_L(s)}{Z_L(s) + Z_{syn}(s)} \times H_{V_L,V_O}(s) \qquad \text{EQ. 5}$$

where, $V_o(s)$ is the voltage waveform at the sink terminal of the interconnect attached to the macro Laplace domain; $V_{in}(s)$ is the voltage waveform at the input of the internal interconnect segment attached to the macro PO; $Z_L(s)$ is the load impedance to ground in Laplace domain; $Z_{syn}(s)$ is the impedance of the synthesized RC(L) network in Laplace domain; and $H_{V_L,V_O}(s)$ is the impulse response of an interconnect spanning from the PO of the macro to the sink terminal of the interconnect Referring to FIG. 7, a flow chart illustrating an embodiment of the invention is shown, in which method 700 analyzes a circuit using a timing abstract model of a macro that captures the interaction between parasitics of internal interconnects connected to the macro PO and the external interconnect parasitics attached thereto.

Method 700 is initialized in step 701. In step 702, the circuit is read in along with the abstracted macros, glue logics connecting the macros together, their interconnect parasitics, and timing models. The abstracted macro may be an abstracted model of a gate level design or a transistor level design with industry standard timing models, such as Liberty©, ECSM©, and the like. A static timing analysis of the circuit is subsequently initiated from the PI of the circuit in step 703, wherein timing quantities like delays and slews are computed and propagated throughout the timing graph to obtain arrival times at the primary outputs. The required arrival times are propagated in a conventional manner, and slacks are obtained for each timing point of the timing graph. This step may include conventional static timing analysis components like coupling analysis, common path pessimism reduction, and report generation.

In step 702, when the abstract models are read, timing arcs with predetermined interconnect parasitics are identified. Therefore, initially, all the macro POs with predetermined interconnect parasitics are considered to have been marked. In step 704 and 705, when STA reaches a marked macro PO i, a delay/slew/waveform of the interconnect segment is obtained for each interconnect segment attached to PO i, and an RC(L) network is synthesized such that the impulse response transfer function of the RC(L) network and timing tables follow each other closely (details of which are described in FIG. 5). The interconnect network connected to the macro PO i outside the macro is marked in step 706. Subsequently, the synthesized RC(L) network is stitched to the RC(L) network created in step 705. (This step is described in detail with reference to FIG. 6). Subsequently, an interconnect timing analysis is performed. In step 707, delay/slew/waveforms are computed from the resultant interconnect timing analysis and the results are preferably reported. PO i is then unmarked in step 708 to indicate that all the internal interconnect segments attached to PO i are synthesized.

In step 709, the method checks for any remaining marked macro POs in the circuit. If a marked primary output is encountered, the method restarts the process from step 704. If none is found, in step 710, the method verifies whether all the circuit POs have been reached. If not, the algorithm branches to step 703; otherwise, the process is terminated (step 711).

It should be noted that although not explicitly specified, one or more steps of the methods described herein may include a storing, displaying and/or outputting step as required for a particular application. Any data, records, fields, and/or intermediate results previously described can be stored, displayed, and/or outputted to another device, as required for a particular application. Furthermore, steps or blocks in the accompanying figures that recite a determining operation or involve a decision, do not necessarily require that both branches of the determining operation be practiced. Alternatively, one of the branches of the determining operation can be deemed as an optional step.

The present invention can be realized in hardware, software, or a combination of hardware and software. The present invention can be realized in a centralized fashion in one computer system or in a distributed fashion where different elements are spread across several interconnected computer systems. Any kind of computer system—or other apparatus adapted for carrying out the methods described herein—is suitable. A typical combination of hardware and software could be a general purpose computer system with a computer program that, when being loaded and executed, controls the computer system such that it carries out the methods described herein.

The present invention can also be embodied in a computer program product, which comprises all the features enabling the implementation of the methods described herein, and which—when loaded in a computer system—is able to carry out the methods.

Computer program means or computer program in the present context mean any expression, in any language, code or notation, of a set of instructions intended to cause a system having an information processing capability to perform a particular function either directly or after conversion to another language, code or notation and/or reproduction in a different material form.

While the present invention has been particularly described in conjunction of a simple illustrative embodiment, it is to be understood that one of ordinary skill in the art can extend and apply the invention in many obvious ways. While the illustrative example shows a small circuit and a small corresponding timing graph, the invention can be applied to circuits and graphs of any size. The invention applies to any type of static timing, including but not limited to deterministic or statistical static timing of gate-level circuits, transistor-level circuits, hierarchical circuits, circuits with combinational logic, circuits with sequential logic, timing in the presence of coupling noise, timing in the presence of multiple-input switching, timing in the presence of arbitrary timing tests such as setup, hold, end-of-cycle, pulse width, clock gating and loop-cut tests, and timing in the presence of multiple clock domains. It is also to be understood that many alternatives, modifications and variations will be apparent to those skilled in the art in light of the present description. It is therefore contemplated that the appended claims will embrace any such alternatives, modifications and variations as falling within the true scope and spirit of the present invention.

What is claimed is:

1. A method of enhancing a performance of circuits integral to a VLSI chip using a static timing analysis of an integrated circuit (IC) macro abstract model, the method comprising:
   a. identifying an interconnect segment of the macro abstract model and its timing model that is connected to one or more abstract primary outputs;
   b. synthesizing an electrical network from said timing model and incorporating said synthesized electrical network into said interconnect segment;
   c. stitching said synthesized electrical network with electrical parasitics of an external interconnect connected to one or more of said abstract primary outputs;
   d. performing with a computer a static timing analysis on the interconnects of said stitched electrical network; and
   e. modifying said circuits integral to said VLSI chip by applying thereto results from said interconnect static timing analyses of said macro abstract models.

2. The method as recited in claim 1, wherein said synthesized electrical network is a passive network comprising a resistive capacitive (RC) or a resistive inductive capacitive (RLC) network or a combination thereof RC(L).

3. The method as recited in claim 1, wherein said synthesized electrical network comprises matching impulse response transfer functions of said electrical network and said abstract interconnect segment timing model.

4. The method as recited in claim 1, further comprising performing a model order reduction on said electrical parasitics of said external interconnect prior to said network stitching.

5. The method as recited in claim 4, wherein said reduced model order reduction is performed on said stitched electrical network parasitics.

6. The method as recited in claim 1 further comprising incorporating said abstract timing model during a hierarchical static timing analysis of a hierarchical IC chip design.

7. The method as recited in claim 1, wherein in step b), said synthesized electrical network incorporated into said interconnect segment is performed only once per unique macro and is further applied to multiple instances of said macro's abstract model.

8. The method as recited in claim 1, wherein synthesizing said electrical network uses at least one of said abstracted delay, slew, and waveform tables.

9. The method as recited in claim 1, wherein a voltage response of said passive network is synthesized to an input voltage and output load that follow each other.

10. The method as recited in claim 9 further comprising preserving an input-output timing behavior during said synthesis of said passive (RC)L network.

11. The method as recited in claim 10 wherein when a same input signal is applied to said timing table and to said synthesized interconnect, the corresponding output response matches each other.

12. The method as recited in claim 1 further comprising synthesizing an RC(L) network by minimizing the reduced order model response using a selective number of timing quantities in said table.

13. The method as recited in claim 1, wherein internal interconnect parasitics at primary outputs of said macro are abstracted using delay and slew tables.

14. The method as recited in claim 1 wherein when abstracting said models, timing arcs with predetermined interconnect parasitics are identified.

15. The method as recited in claim 1, wherein said circuit is analyzed using a timing abstract model of said macro, capturing interactions between parasitics of internal interconnects connected to the primary output of said macro, and external interconnect parasitics attached to said macro.

16. A program storage device readable by a machine, tangibly embodying a program of instructions executable by the machine to perform method steps of enhancing a performance of circuits integral to a VLSI chip using a static timing analysis of an integrated circuit (IC) macro abstract model, the method comprising:

a. identifying an interconnect segment of the macro abstract model and its timing model that is connected to one or more abstract primary outputs;

b. synthesizing an electrical network from said timing model and incorporating said synthesized electrical network into said interconnect segment;

c. stitching said synthesized electrical network with electrical parasitics of an external interconnect connected to one or more of said abstract primary outputs;

d. performing with a computer a static timing analysis on the interconnects of said stitched electrical network; and e. modifying said circuits integral to said VLSI chip by applying thereto results from said interconnect static timing analyses of said macro abstract models.

* * * * *